US012046288B2

United States Patent
Ryoo

(10) Patent No.: US 12,046,288 B2
(45) Date of Patent: Jul. 23, 2024

(54) MEMORY DEVICE COMPRISING SOURCE SWITCH TO FLOAT SOURCE LINE OF UNSELECTED MEMORY CELL BLOCK, MEMORY ARRAY AND PROGRAM METHOD USING THE SAME

(71) Applicant: Winbond Electronics Corp., Taichung (TW)

(72) Inventor: Pil-Sang Ryoo, Taichung (TW)

(73) Assignee: Winbond Electronics Corp., Taichung (TW)

( * ) Notice: Subject to any disclaimer, the term of this patent is extended or adjusted under 35 U.S.C. 154(b) by 68 days.

(21) Appl. No.: 17/541,194

(22) Filed: Dec. 2, 2021

(65) Prior Publication Data

US 2023/0178153 A1  Jun. 8, 2023

(51) Int. Cl.
| | | |
|---|---|---|
| *G11C 16/10* | (2006.01) | |
| *G11C 16/04* | (2006.01) | |
| *G11C 16/08* | (2006.01) | |
| *G11C 16/24* | (2006.01) | |
| *G11C 16/28* | (2006.01) | |
| *G11C 16/30* | (2006.01) | |

(52) U.S. Cl.
CPC ........ *G11C 16/102* (2013.01); *G11C 16/0433* (2013.01); *G11C 16/08* (2013.01); *G11C 16/24* (2013.01); *G11C 16/28* (2013.01); *G11C 16/30* (2013.01)

(58) Field of Classification Search
CPC ... G11C 16/102; G11C 16/0433; G11C 16/08; G11C 16/24; G11C 16/28; G11C 16/30; G11C 16/06; G11C 16/12
See application file for complete search history.

(56) References Cited

U.S. PATENT DOCUMENTS

| | | | |
|---|---|---|---|
| 5,033,023 A * | 7/1991 | Hsia | H01L 27/115 365/185.12 |
| 6,111,786 A | 8/2000 | Nakamura | |
| 6,449,188 B1 | 9/2002 | Fastow | |
| 6,570,787 B1 | 5/2003 | Wang et al. | |
| 6,667,906 B2 * | 12/2003 | Park | G11C 16/0416 365/185.24 |
| 6,747,899 B2 | 6/2004 | Hsia et al. | |
| 7,817,472 B2 | 10/2010 | Kuo et al. | |
| 8,274,838 B2 * | 9/2012 | Dutta | G11C 16/3486 365/185.24 |

(Continued)

*Primary Examiner* — Joshua L Schwartz
(74) *Attorney, Agent, or Firm* — JCIPRNET

(57) ABSTRACT

A memory array that includes a plurality of memory blocks and a plurality of source switches is introduced. Each of the source switches corresponds to one of the memory blocks, and each of the source switches is coupled to a common source line of the corresponding one of the memory blocks. A selected source switch, which corresponds to a selected memory block among the memory blocks for a program operation, is configured to bias the common source line of the selected memory block to a reference voltage during a program period of the program operation. An unselected source switch, which corresponds to an unselected memory block among the memory blocks for the program operation, is configured to float the common source line of the unselected memory block during the program period of the program operation.

19 Claims, 6 Drawing Sheets

(56) References Cited

U.S. PATENT DOCUMENTS

| | | | |
|---|---|---|---|
| 8,760,957 B2 * | 6/2014 | Lee | G11C 11/5621 |
| | | | 365/189.08 |
| 8,917,549 B2 | 12/2014 | Pan et al. | |
| 9,384,841 B2 * | 7/2016 | Shim | G11C 5/063 |
| 9,870,825 B2 | 1/2018 | Nam et al. | |
| 9,887,010 B2 * | 2/2018 | Asami | H01L 29/7881 |
| 9,977,627 B1 | 5/2018 | Hung et al. | |
| 10,026,503 B2 | 7/2018 | Kim | |
| 10,062,440 B1 * | 8/2018 | Ryoo | G11C 16/3427 |
| 10,535,407 B2 | 1/2020 | Wong | |
| 2019/0179566 A1 * | 6/2019 | Huang | G11C 16/30 |
| 2021/0312991 A1 * | 10/2021 | Lee | G11C 16/10 |

* cited by examiner

MEMORY DEVICE COMPRISING SOURCE SWITCH TO FLOAT SOURCE LINE OF UNSELECTED MEMORY CELL BLOCK, MEMORY ARRAY AND PROGRAM METHOD USING THE SAME

BACKGROUND

Technical Field

The disclosure relates to a memory device, and more particularly to a memory device having high cell density and low leakage current.

Description of Related Art

Flash memories such as NOR flash memories and NAND flash memories are widely used to store data in many applications. A program operation is performed to write data to a memory cell through a word line, a bit line and a source line coupled to the memory cell to be programmed. However, a conventional memory experiences a bit line leakage current flowing through unselected memory cells during the program operation. The amount of the bit line leakage current increases as a length of the bit line increases. As such, the conventional memory is divided into a plurality of memory blocks having predetermined capacity (i.e., 2 megabytes for each memory block) which corresponding to a predetermined number of word lines. The number of the word lines in each memory block is limited due to the bit line leaking current. In addition, a pair of bit line segmentation circuits are designed at two ends of each memory block to reduce the leakage bit line current during the program operation. However, since the memory includes a large number of memory blocks, the number of bit line segmentation circuits is large, resulting in large-in-size and low cell density memory.

SUMMARY

In view of the above, the disclosure introduces a memory device, a memory array and a program method using the same that are capable of improving the cell density as well as improving program efficiency.

A memory device includes a plurality of memory arrays, in which each of the memory arrays comprises a plurality of memory blocks and a plurality of source switches. Each of the plurality of memory blocks includes a plurality of memory cells that are coupled to a common source line. Each of plurality of source switches corresponds to one of the plurality of memory blocks, and each of plurality of source switches is coupled to the common source line of the corresponding one of the plurality of memory blocks. A selected source switch, which corresponds to a selected memory block among the plurality of memory blocks for a program operation, is configured to apply a reference voltage to the common source line of the selected memory block during a program period of the program operation. An unselected source switch, which corresponds to an unselected memory block among the plurality of memory blocks for the program operation, is configured to float the common source line of the unselected memory block during the program period of the program operation.

A memory array includes a plurality of memory blocks and a plurality of source switches, in which the of the plurality of memory blocks includes a plurality of memory cells that are coupled to a common source line. Each of plurality of source switches corresponds to one of the plurality of memory blocks, and each of plurality of source switches is coupled to the common source line of the corresponding one of the plurality of memory blocks. A selected source switch, which corresponds to a selected memory block among the plurality of memory blocks for a program operation, is configured to bias the common source line of the selected memory block to a reference voltage during a program period of the program operation. An unselected source switch, which corresponds to an unselected memory block among the plurality of memory blocks for the program operation, is configured to float the common source line of the unselected memory block during the program period of the program operation.

DESCRIPTION OF THE EMBODIMENTS

Figure 1:
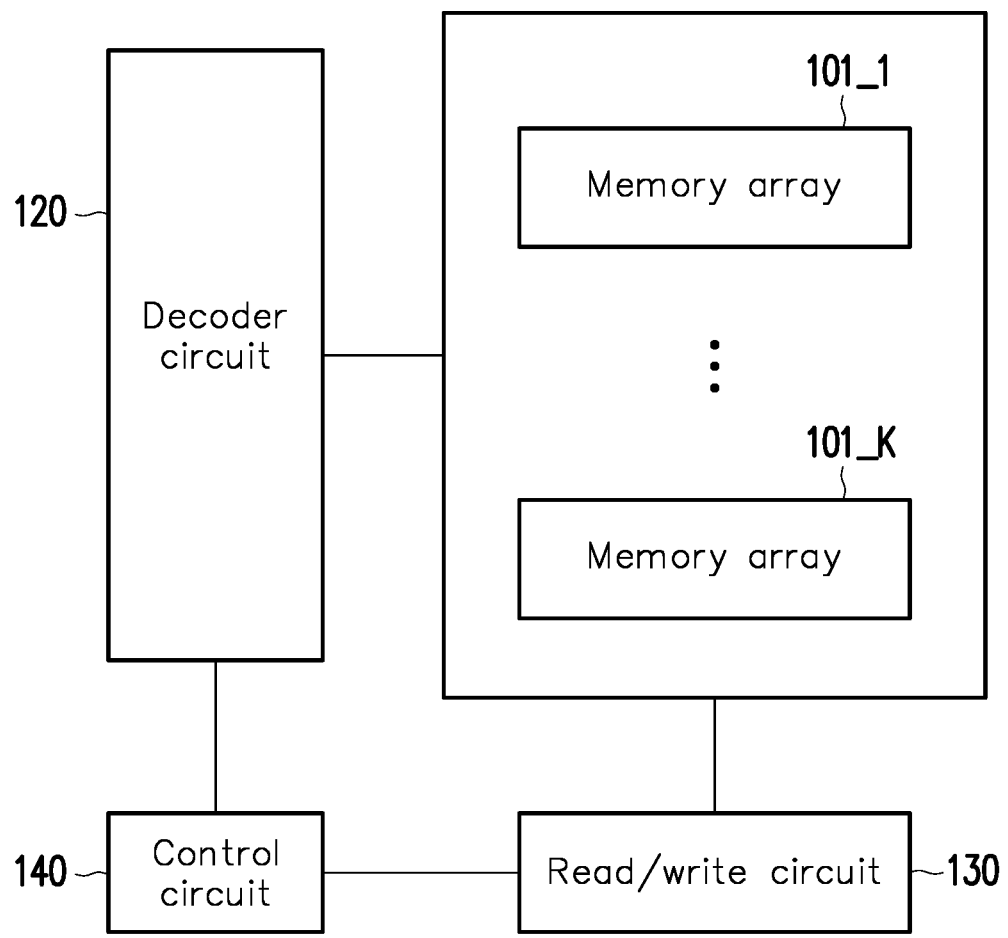
FIG. 1 is a schematic diagram illustrating a memory device in accordance with some embodiments.

FIG. 1 illustrates a schematic diagram of a memory device 100 that includes a memory chip 110, a decoder circuit 120, a read/write circuit 130 and a control circuit 140. The memory device 100 may include more components than what are shown in FIG. 1. The memory chip 110 includes a plurality of memory arrays 101_1 through 101_k, in which each of the memory arrays 101_1 through 101_k includes a plurality of memory cells (not shown) for storing data. In an embodiment, each of the memory arrays 101_1 through 101_k includes a plurality of memory blocks and a pair of bit line segmentation circuits that is configured to separate bit lines of one of the memory arrays 101_1 through 101_k from bit lines of another one of the memory arrays 101_1 through 101_k. In an embodiment, each of the memory blocks may have a predetermined capacity, and only one pair of bit line segmentation circuits is included in each of the memory arrays 101_1 through 101_k. In this way, a number of the bit line segmentation circuits is reduced in comparison with the design in the conventional memory. In an embodiment, the memory blocks in each of the memory arrays 101_1 through 101_k are formed in a single semiconductor well. In an embodiment, the memory arrays 101_1 through 101_k are NOR memory arrays, but the disclosure is not limited to any particular type of memory.

The decoder circuit 120 is coupled to the memory chip 110, and configured to decode an address signal to select memory cells in the memory arrays 101_1 through 101_k for a memory operation (i.e., a read operation or a program operation). The decoder circuit 120 may include a row decoder circuit (not shown) and a column decoder circuit (not shown) for decoding the address of the memory cells in the memory arrays. The read/write circuit 130 is coupled to the memory chip 110, and is configured to perform the read operation for reading data stored in the selected memory or to perform a program operation for writing data to the selected memory cells. The read/write circuit 130 may include a sense amplifier (not shown) that is configured to sense data stored in the selected memory cells during the read operation. The read/write circuit 130 may also includes circuitry for writing data to the selected memory cell in the program operation. The control circuit 140 is coupled to the decoder circuit 120 and the read/write circuit 130 to control operations of the decoder circuit 120 and the read/write circuit 130. For example, the control circuit 140 may send control signals to the decoder circuit 120 to control the decoding operation performed by the decoder circuit 120. The control circuit 140 may sends control signals to the read/write circuit 130 for performing the read operation or the program operation.

Figure 2:
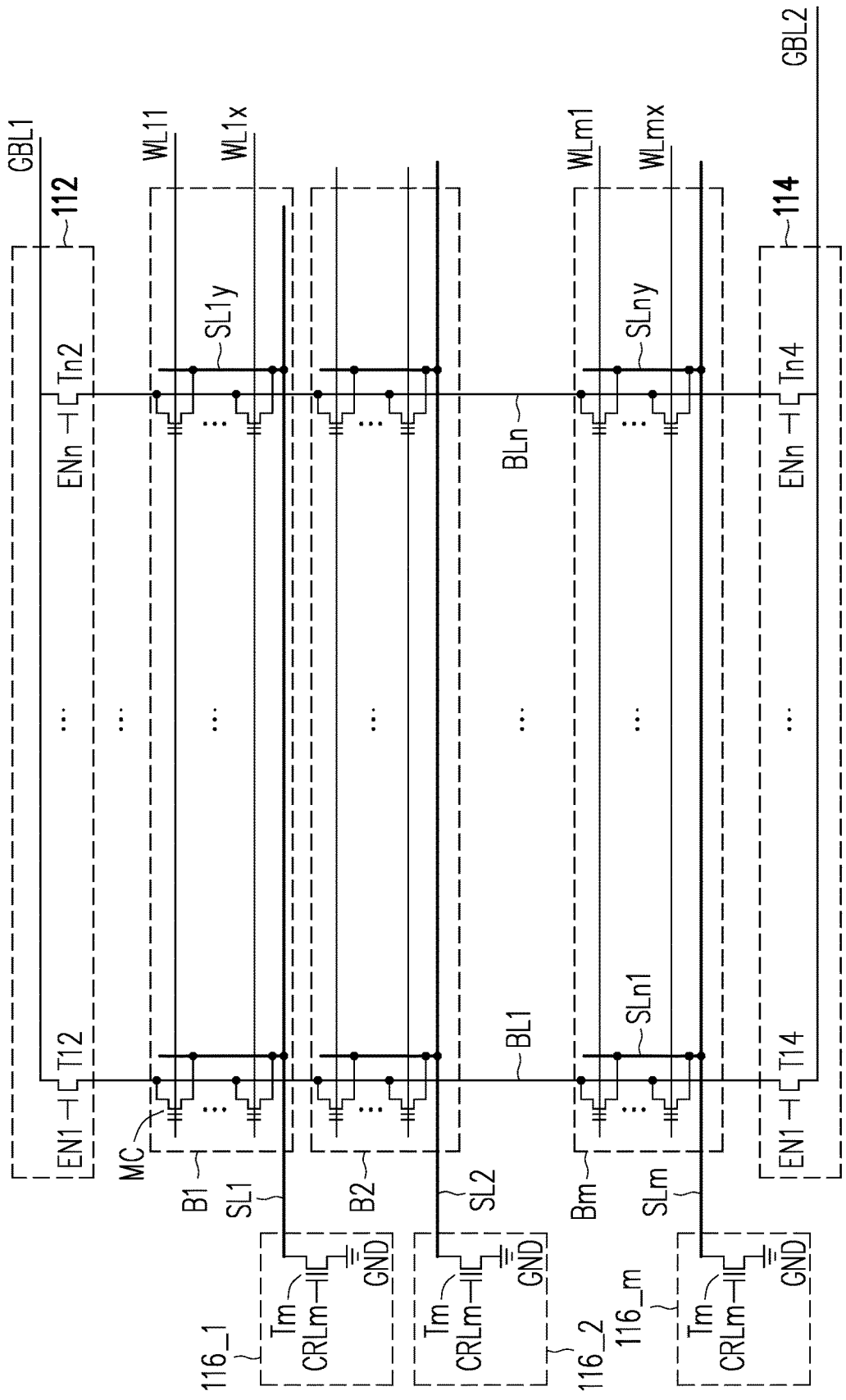
FIG. 2 is a schematic diagram illustrating a memory array in accordance with some embodiments.

FIG. 2 illustrates a schematic diagram of a memory array 101 in accordance with some embodiments of the disclosure. The memory array 101 shown in FIG. 2 could be any one of the memory arrays 101_1 through 101_k of the memory device 100 shown in FIG. 1. The memory array 101 includes a plurality of memory blocks B1 through Bm, a plurality of common source lines SL1 through SLm, a plurality of source switches 116_1 through 116_m, and a pair of bit line segmentation circuits 112 and 114. Each of the source switches 116_1 through 116_m corresponds to one of the memory blocks B1 through Bm; and each of the common source lines SL1 through SLm is coupled between one of the memory blocks B1 through Bm and a corresponding one of the source switches 116_1 through 116_m. For example, the common source line SL1 is coupled between the memory block B1 and the source switch 116_1, and the common source line SLm is coupled between the memory block Bm and the source switch 116_m. The memory blocks B1 through Bm of the memory array 101 may be formed in a single semiconductor well.

Each of the memory blocks B1 through Bm may include a plurality of memory cells MC that are arranged in an array structure including a plurality of rows and a plurality of columns. The memory cells MC in the memory blocks B1 through Bm are coupled to a plurality of local source lines, a plurality of local word lines, and a plurality of bit lines. For example, the memory cells MC in the memory block B1 are coupled to local source line SL11 through SL1y, local word lines WL11 through WL1x and bit lines BL1 through BLn. Similarly, the memory cells MC of the memory block Bm are coupled to local source lines SLn1 through SLny, local word lines WLm1 through WLmx, and the bit lines BL1 through BLn, where m, n, x and y are positive integers. The local source lines of a specific memory block among the memory blocks B1 through Bm is coupled to a common source line corresponding to the specific memory block. For example, the local source lines SL11 through SL1y of the memory block B1 are coupled to the common source line SL1, and the local source lines SLn1 through SLny of the memory block Bm is coupled to the common source line SLm. The bit lines BL1 through BLn are coupled to a column of memory cells in the memory array 101. In other words, unlike the local word lines and the local source lines that are only coupled to memory cells of a memory block corresponding to the local word lines and the local bit lines, the bit lines BL1 through BLn are coupled to a group of memory cells in all memory blocks B1 through Bm. An operation such as a read operation or a program operation to the memory cells MC is performed through the local source lines, the local word lines, and the bit lines coupled to the memory cells MC.

In an embodiment, the bit line segmentation circuits 112 and 114 are coupled to the bit lines BL1 through BLn of the memory array 101, and are configured to segment the bit lines BL1 through BLn of the memory array 101 from bit lines of other memory array in the memory chip (i.e., memory chip 110 in FIG. 1). In the embodiment, each of the bit line segmentation circuits 112 and 114 include a plurality of switches, where each of the switches is coupled to a bit line among the bit lines BL1 through BLn. The bit line segmentation circuit 112 includes switches T12 through Tn2 that are coupled to first ends of the bit lines BL1 through BLn, respectively. Similarly, the bit line segmentation circuit 114 includes switches T14 through Tn4 that are coupled to second ends of the bit lines BL1 through BLn, respectively. In other words, each of the bit lines BL1 through BLn is coupled to one of the switches T12 through Tn2 of the bit line segmentation circuit 112 and one of the switches T14 through Tn4 of the bit line segmentation circuit 114. For example, the bit line BL1 is coupled to the switches T12 and T14 of the of the bit line segmentation circuits 112 and 114, and the bit line BLn is coupled to the switches Tn2 and Tn4 of the of the bit line segmentation circuits 112 and 114.

The switches T12 through Tn2 of the bit line segmentation circuit 112 are coupled between the bit lines BL1 through BLm and a global bit line GBL1, and the switches T14 through Tn4 of the bit line segmentation circuit 114 are coupled between the bit lines BL1 through BLm and a global bit line GBL2. The global bit line GBL1 could be electrically coupled to the global bit line GBL2 or could be electrically isolated from the global bit line GBL2 according to designed needs. In an embodiment, the switches T12 through Tn2 and the switches T14 through Tn4 are transistors having control terminals receiving enable signals EN1 through ENn, but the disclosure is not limited thereto. Any circuit that has a switching function fall within the scope of the disclosure. The enable signals EN1 through ENn may be generated by a control circuit (i.e., control circuit 140 in FIG. 1). In addition, switches that are coupled to a same bit line is controlled by the same enable signal. For example, the switches T12 and T14, which are coupled to the same bit line BL1, are controlled by the same enable signal EN1; and the switches Tn2 and Tn4, which are coupled to the same bit line BLn, are controlled by the same enable signal ENn.

In an embodiment, each of the source switches 116_1 through 116_m includes a transistor having a first terminal, a second terminal and a control terminal. The first terminal of the transistor is coupled to one of the common source lines SL1 through SLm, the second terminal of the transistor is coupled to a reference node GND, and the control terminal of the transistor receives a control signal. For example, the source switch 116_1 includes a transistor T1 being coupled between the common source line SL1 and the reference node GND and being controlled by the control signal CRL1. Similarly, the source switch 116_m includes a transistor Tm being coupled between the common source line SLm and the reference node GND and being controlled by the control signal CRLm. The control signals CRL1 through CRLm may be generated and provided by an external circuit (i.e., control circuit 140 as shown in FIG. 1).

The source switches 116_1 through 116_m may be controlled individually by the control signals CRL1 through CRLm according to an operation that is performed on a memory block corresponding to the source switch. In a program operation to memory cells in a selected memory block, the source switch corresponding to the selected memory block is switched on, while the source switch corresponding to an unselected memory block is switched off. For example, it supposes that the memory block B1 is the selected memory block for the program operation, and other memory blocks B2 trough Bm are unselected memory blocks for the program operation. The source switch 116_1 corresponding to the selected memory block B1 is switched on to electrically connect the common source line SL1 to the reference node GND, thereby applying the reference voltage (i.e., ground voltage) to the common source line SL1 of the selected memory block B1. Meanwhile, the source switches 116_2 through 116_m corresponding to the unselected memory blocks B2 trough Bm are switched off, thereby floating the common source lines SL2 through SLm of the unselected memory blocks B2 through Bm in the program operation.

Figure 3:
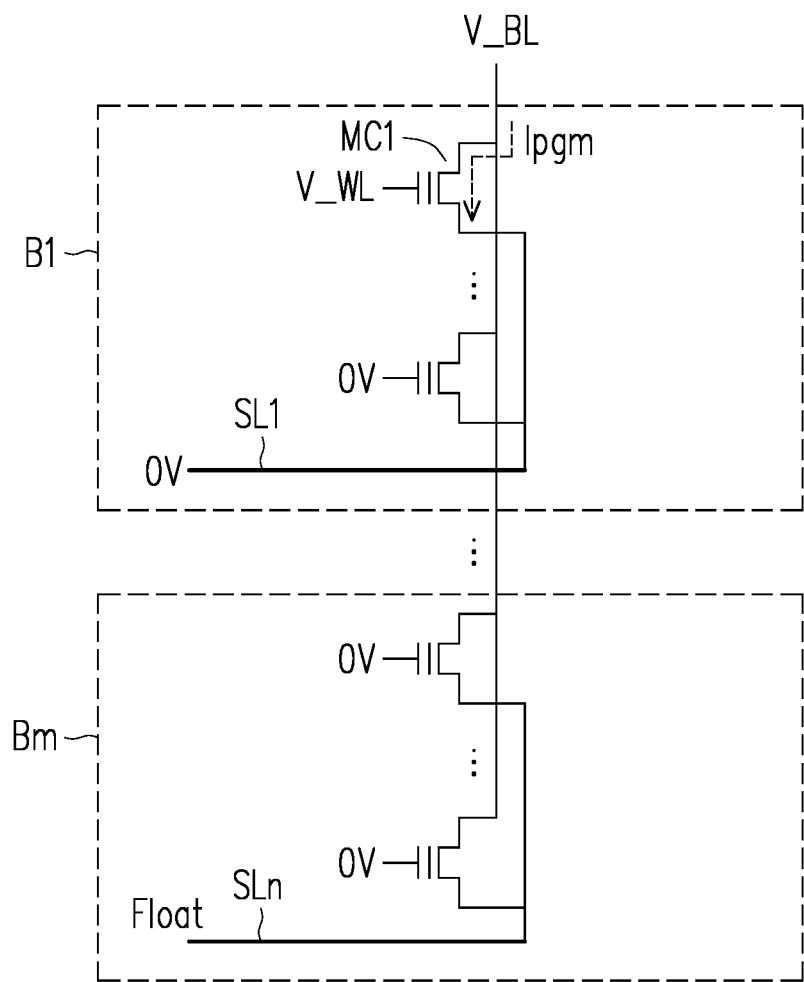
FIG. 3 is a schematic diagram illustrating memory blocks during a program operation in accordance with some embodiments.

FIG. 3 shows an example of voltages applied to memory cells of memory blocks B1 through Bm during a program operation to a memory cell MC1 of the memory block B1 in accordance with some embodiments. It assumes that the memory block B1 that includes the memory cell MC1 is the selected memory block for the program operation, and the other memory blocks including memory block Bm are unselected memory blocks. Referring to FIG. 2 and FIG. 3, the source switch 116_1 is switched on by the control signal CRL1 to apply the reference voltage to the common source line SL1 corresponding to the selected memory block B1 during a program period of the program operation. Meanwhile, the source switch 116_m is switched off by the control signal CRLm to float the common source line SLm corresponding to the unselected memory block Bm during the program period. In addition, a voltage V_WL is applied to the word line WL11 being coupled to the selected memory cell MC1, and a program voltage V_BL is applied to the bit line BL1 being coupled to the selected memory cell MC1 the program period. Accordingly, a program current Ipgm flows through the selected memory cell MC1 to program data to the selected memory cell MC1.

The source lines coupled to the memory cells of the unselected memory block Bm are floated and the word lines coupled to the memory cells of the unselected memory block Bm are applied with the reference voltage (i.e., 0 volt). As such, a bit line leakage current occurred due to high drain voltage between the bit line and the source line of unselected memory cells is suppressed, and no bit line leakage current is flowing through the memory cells of the unselected block Bm. As a result, more memory blocks may be included in the memory array 101 and less bit line segmentation circuits in the memory array 101 is required without reducing efficiency of the program operation to the memory array 101. In an embodiment, only one pair of bit line segmentation circuits (i.e., bit line segmentation circuits 112 and 114 in FIG. 2) is required for all memory blocks B1 through Bm in the memory array 101. In comparison with the conventional memory where each of the memory blocks must include a pair of the bit line segmentation circuits, the memory array 101 in the disclosure has much higher cell density without reducing the program efficiency. For example, a pair of the bit line segmentation circuits is required for each 2 Mb memory block in the conventional memory, while the pair of the bit line segmentation circuits could be designed for in each 4 Mb, 8 Mb, 16 Mb, and so on, without reducing the program efficiency.

Figure 4A:
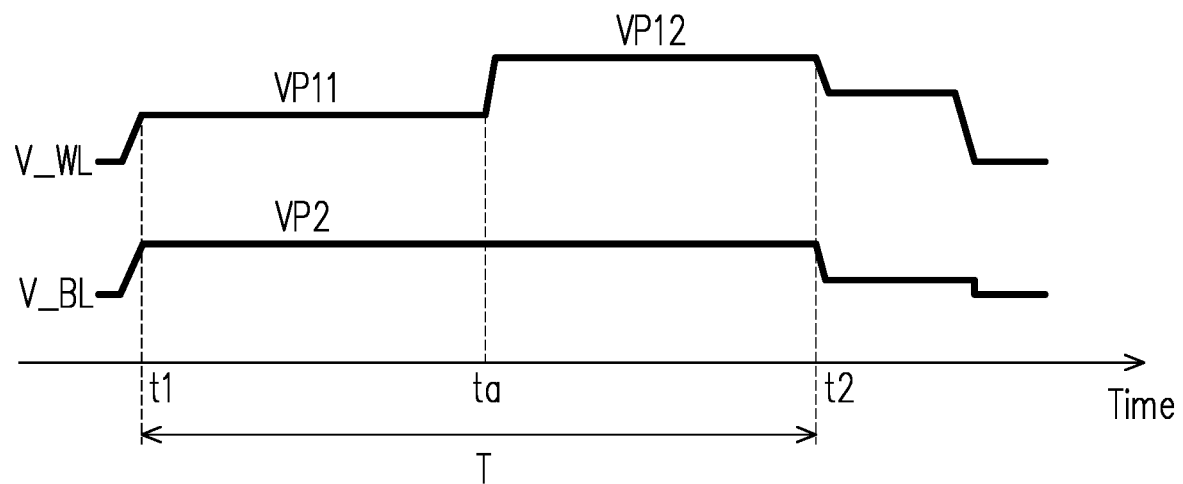
FIGS. 4A to 4C are waveform diagrams illustrating a word line voltage and bit line voltage during a program operation in accordance with some embodiments.
Figure 4B:
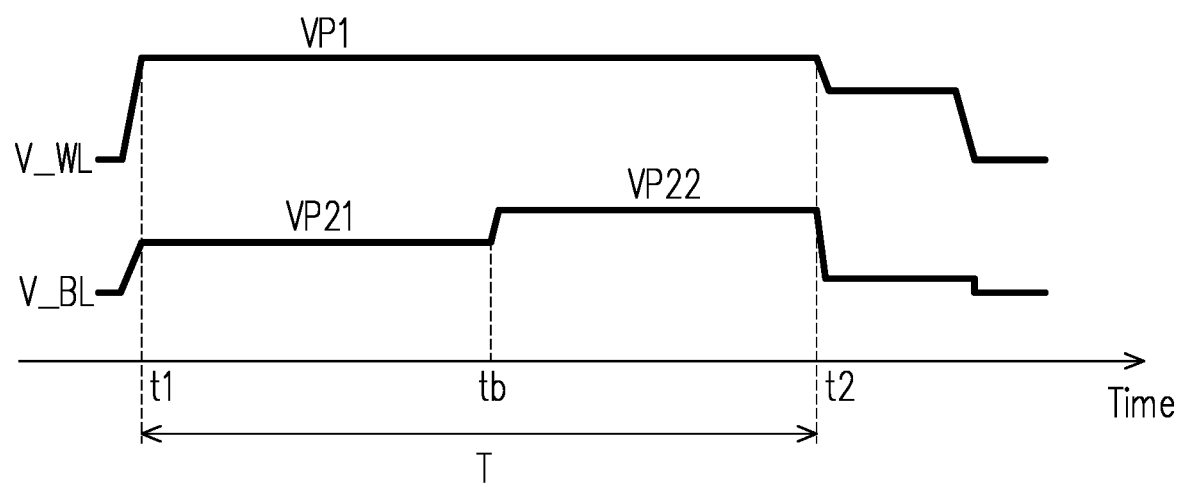
Figure 4C:
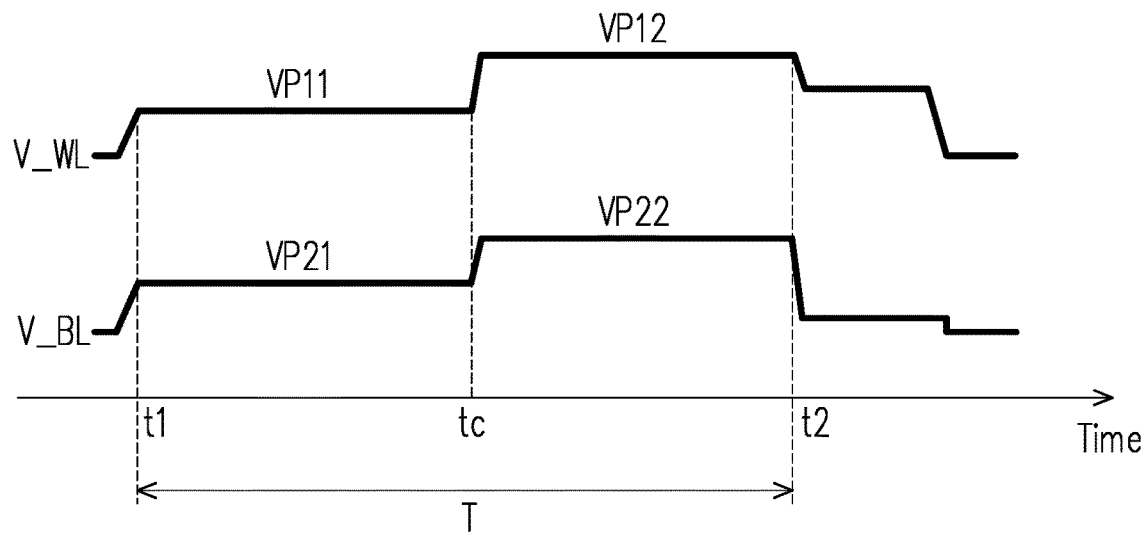

FIG. 4A to FIG. 4C illustrate waveform diagrams of a word line voltage V_WL and a bit line voltage V_BL for programming a selected memory cell (or a page of memory cells) during a program period T of a program operation in accordance with some embodiments. A page of memory cells selected for may refer to memory cells in a row of the memory array; and the program period T of the program operation refers to the time period from timing t1 to timing t2 shown in FIG. 4A to FIG. 4C. In FIG. 4A to FIG. 4C, the reference voltage (i.e., 0V) is applied to the source line coupled to the selected memory cell during the program period T of the program operation. In the program period, the selected memory cell is changed from an original threshold voltage to a target threshold voltage.

Referring FIG. 4A, during the program period T, the bit line coupled to the selected memory cell is applied with the bit line voltage V_BL, and the word line coupled to the selected memory cell is applied with the word line voltage V_WL. The word line voltage V_WL is an incremental step pulse programming voltage (ISPP) that include a plurality of incremental voltage pulses. The word line voltage V_WL shown in FIG. 4A is a two-step ISPP voltage that includes voltage pulses VP11 and VP22, in which a level of the voltage pulse VP11 is less than a voltage level of the voltage pulse VP12. The voltage pulse VP11 of the word line voltage V_WL is applied to the word line coupled to the selected memory cell during a first period from timing t1 to timing ta, and the voltage pulse VP12 of the word line voltage V_WL is applied to the word line coupled to the selected memory cell during a second period from timing ta to timing t2. It is noted that a number of voltage pulses included in the word line voltage V_WL and time lengths of the first period from timing t1 to ta and the second period from ta to t2 are not limited in the disclosure. In addition, the bit line voltage V_BL which is a single pulse voltage VP2 is applied to the bit line coupled to the selected memory cell during the program period T.

Figure 4D:
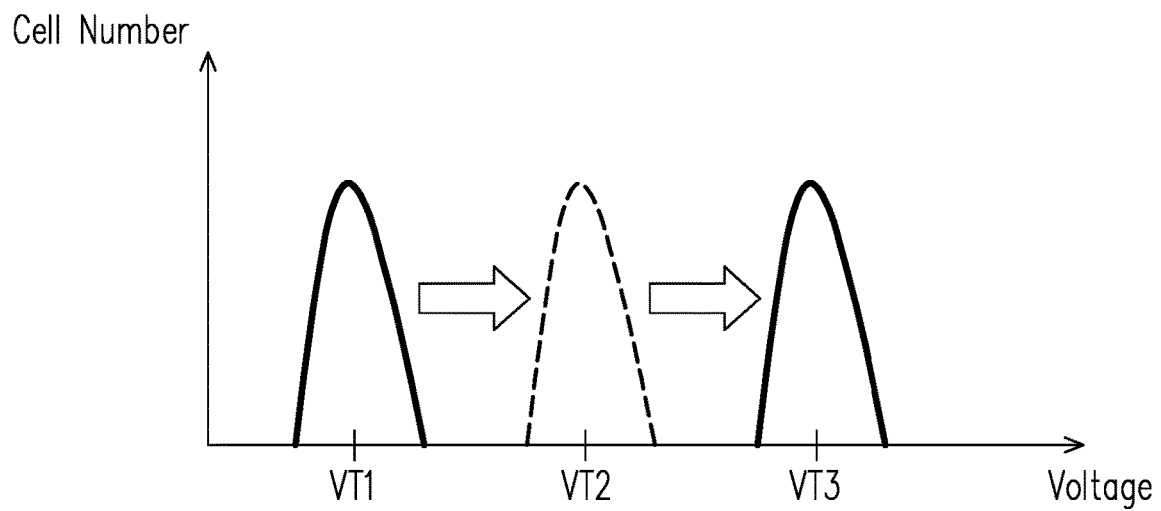
FIG. 4D illustrate threshold distribution of memory cells in the memory array in accordance with some embodiments.

FIG. 4D illustrates a distribution of the threshold voltages of the memory cells during a program operation in accordance with some embodiments. A vertical axis shown in FIG. 4D is the number of memory cells, and the horizontal axis shown in FIG. 4D is the threshold voltages of the memory cells. Referring to FIGS. 4A and 5D, the threshold voltage of selected memory cell is not pushed immediately from the original threshold voltage VT1 to the target threshold voltage VT3. Instead, the threshold voltage of selected memory cell is pushed from the original threshold voltage VT1 to an immediate threshold voltage VT2 by the voltage pulse VP11 of the word line voltage V_WL first. Then, the threshold voltage of selected memory cell is pushed from the immediate threshold voltage VT2 to the target threshold voltage VT3 by the voltage pulse VP12 of the word line voltage V_WL.

FIG. 4B illustrates the waveform diagram of the word line voltage V_WL and the bit line voltage V_BL in accordance with an embodiment of the disclosure. A difference between the waveform diagrams of the word line voltage V_WL and the bit line voltage V_BL in FIG. 4A and FIG. 4B is that the word line voltage V_WL is a single pulse voltages VP1, and the bit line voltage V_BL is the multi-step ISPP voltage. In FIG. 4B, the word line voltage V_WL is the single pulse voltage having a voltage level VP1, while the bit line voltage V_BL is the two-step ISPP voltage that includes voltage pulses VP21 and VP22. The voltage pulse VP21 of the bit line voltage V_BL is applied to the bit line coupled to the selected memory cell during the first period from timing t1 to timing tb, and the voltage pulse VP22 of the bit line voltage V_BL is applied to the bit line coupled to the selected memory cell during the second period from timing tb to timing t2. Referring to FIGS. 4B and 5D, since the bit line coupled to the selected memory cell is applied with a multi-step ISPP voltage, the threshold voltage of selected memory cell is pushed from the original threshold voltage VT1 to the immediate threshold voltage VT2 by the voltage pulse VP21, before being pushed to the target threshold voltage VT3 by the voltage pulse VP22.

FIG. 4C illustrates the waveform diagram of the word line voltage V_WL and the bit line voltage V_BL in accordance with an embodiment of the disclosure. A difference between the waveform diagrams of the word line voltage V_WL and the bit line voltage V_BL in FIG. 4A and FIG. 4C is that the both the word line voltage V_WL and the bit line voltage V_BL are multi-step ISPP voltages. In FIG. 4C, the word line voltage V_WL includes voltages pulses VP11 and VPP12, in which the voltage level of the voltages pulse VP11 is less than the voltage level of the voltage pulse VP12. The bit line voltage V_BL includes voltage pulses VP21 and VP22, in which the voltage level of the voltages pulse VP21 is less than the voltage level of the voltage pulse VP22. During the first period from timing t1 to timing tc, the voltage pulse VP11 is applied to the word line coupled to the selected memory cell, and the voltage pulse VP21 is applied to the bit line coupled to the selected memory cell. During the second period from timing tc to timing t2, the voltage pulse VP12 is applied to the word line coupled to the selected memory cell, and the voltage pulse VP22 is applied to the bit line coupled to the selected memory cell.

Referring to FIG. 4A to FIG. 4C, as multi-step ISPP voltages are applied to the bit line, the word line or both of the word line and the bit line coupled to the selected memory cell, the program current flowing through the bit line to the selected memory cell is reduced, the bit line voltage drop due to parasitic resistance of the bit line is reduced, and less power consumption is required for the program operation. Accordingly, the efficiency of the program operation to the memory cells are improved.

Figure 5:
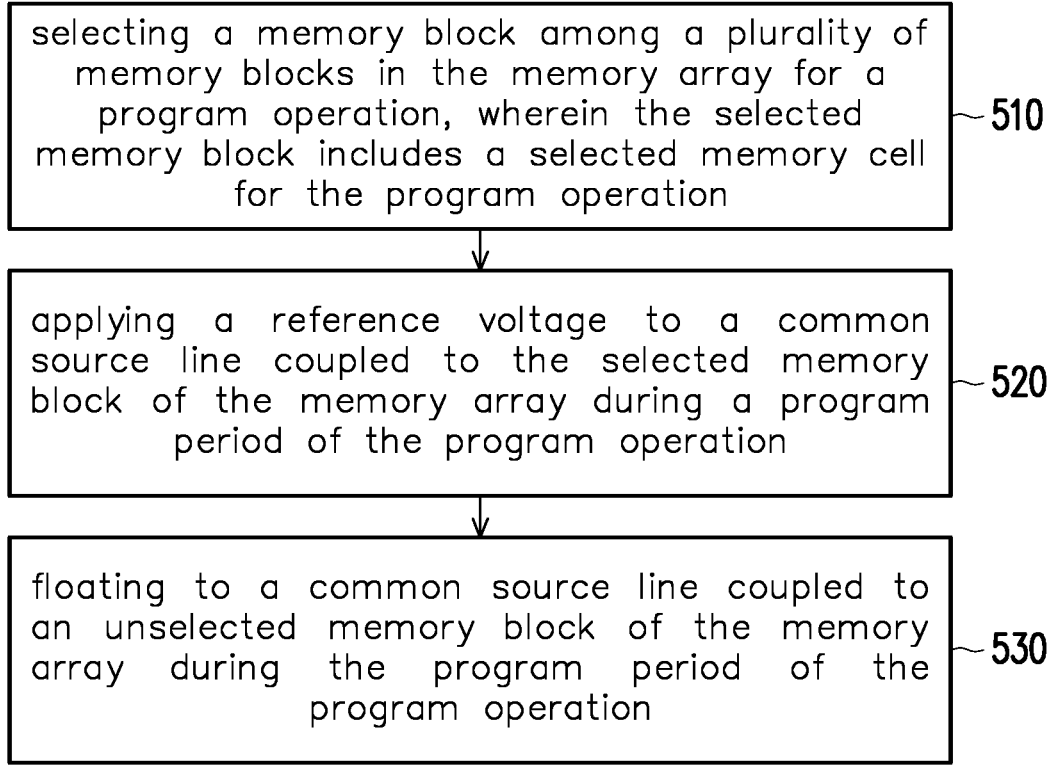
FIG. 5 is a flowchart diagram illustrating a program method in accordance with some embodiments.

FIG. 5 illustrates a flowchart diagram of program method in accordance with some embodiments. In block 510, a memory block among a plurality of memory blocks in a memory array is selected for a program operation, wherein the selected memory block includes a selected memory cell for the program operation. In block 520, a reference voltage is applied to a common source line coupled to the selected memory block of the memory array during a program period of the program operation. In block 530, a common source line coupled to an unselected memory block of the memory array is floated during the program period of the program operation.

In summary, a common source line coupled to a selected memory block for the program operation is applied with a reference voltage (i.e., 0 volt), and a common source line coupled to the unselected memory block is floated. In this way, a bit line leaking current flowing through unselected memory cells of unselected memory block is suppressed. In addition, a plurality of source switches in a memory array are controlled independently to apply the reference voltage to the selected memory block and to float the unselected memory blocks. In this way, the number of the memory blocks included in each memory array could be increased without increasing the bit line leakage current. Also, only a pair of the bit line segmentation circuits is required for the entire memory array, thus the number of the bit line segmentation circuits in the memory array is reduced, the cell density in the memory array is increased, and the size of the memory array is reduced. Furthermore, multi-step ISPP voltage is applied to a bit line and/or word line coupled to selected memory cells, thereby improving efficiency of the program operation to the memory array.

Although the embodiment of the disclosure has been described in detail, the disclosure is not limited to a specific embodiment and various modifications and changes are possible within the scope of the disclosure disclosed in the claims.

What is claimed is:

1. A memory device, comprising:
a plurality of memory arrays, each of the memory array comprises:
a plurality of memory blocks, each of the plurality of memory blocks includes a plurality of memory cells that are coupled to a common source line;
a plurality of source switches, each of plurality of source switches corresponds to one of the plurality of memory blocks, and each of plurality of source switches is coupled to the common source line of the corresponding one of the plurality of memory blocks;
a plurality of bit lines, each of the plurality of bit lines is coupled to a group of memory cells in each of the plurality of memory blocks; and
a plurality of bit line segmentation circuits, coupled to the plurality of bit lines of the memory array, segmenting the plurality of bit lines of one of the plurality of memory arrays from another one of the plurality of the memory arrays,
wherein a selected source switch, which corresponds to a selected memory block among the plurality of memory blocks for a program operation, is configured to apply a reference voltage to the common source line of the selected memory block during a program period of the program operation, and
wherein an unselected source switch, which corresponds to an unselected memory block among the plurality of memory blocks for the program operation, is configured to float the common source line of the unselected memory block during the program period of the program operation.

2. The memory device according to claim 1, wherein each of the plurality of source switches is controlled independently according to a control signal.

3. The memory device according to claim 2, wherein each of the plurality of source switches is coupled between the common source line of the corresponding one of the plurality of memory blocks and a reference node that receives the reference voltage,
the selected source switch corresponding to the selected memory block is turned on to bias the common source line of the selected memory block to the reference voltage during the program period, and
the unselected source switch corresponding to the unselected memory block is turned off to float the common source line of the unselected memory block during the program period.

4. The memory device according to claim 1, wherein each of the memory arrays includes only two bit line segmentation circuit segments,
a first bit line segmentation circuit is coupled to a first end of each of the plurality of bit lines; and
a second bit line segmentation circuit is coupled to a second end of each of the plurality of bit lines.

5. The memory device according to claim 1, wherein the plurality of memory arrays are NOR memory arrays, the plurality of memory blocks in each of the memory arrays are formed in a single semiconductor well, and each of the plurality of memory blocks include a predetermined number of the memory cells.

6. The memory device according to claim 1, wherein
the selected memory block includes a selected memory cell for the program operation,
the selected memory cell is coupled to a selected bit line, a selected word line and a selected source line,
a reference voltage is applied to the selected source line during the program period, and
a word line voltage is applied to the selected word line during the program period, wherein word line bias voltage including a first word line voltage pulse and a second word line voltage pulse that is greater than the first word line voltage pulse,
the first word line voltage pulse is applied to the selected word line during a first period of the program period, and the second word line voltage pulse is applied to the selected word line during a second period of the program period.

7. The memory device according to claim 1, wherein
the selected memory block includes a selected memory cell for the program operation,
the selected memory cell is coupled to a selected bit line, a selected word line and a selected source line,
a reference voltage is applied to the selected source line during the program period, and
a bit line voltage is applied to the selected bit line during the program period, wherein bit line bias voltage is including a first bit line voltage pulse and a second bit line voltage pulse that is greater than the first bit line voltage pulse,
the first bit line voltage pulse is applied to the selected bit line during a first period of the program period, and the second bit line voltage pulse is applied to the selected bit line during a second period of the program period.

8. The memory device according to claim 1, wherein
the selected memory block includes a selected memory cell for the program operation,
the selected memory cell is coupled to a selected bit line, a selected word line and a selected source line,
a reference voltage is applied to the selected source line during the program period, and
a word line voltage is applied to the selected word line during the program period, wherein word line bias voltage including a first word line voltage pulse and a second word line voltage pulse that is greater than the first word line voltage pulse,
the first word line voltage pulse is applied to the selected word line during a first period of the program period, and the second word line voltage pulse is applied to the selected word line during a second period of the program period,
a bit line voltage is applied to the selected bit line during the program period, wherein bit line bias voltage including a first bit line voltage pulse and a second bit line voltage pulse that is greater than the first bit line voltage pulse,
the first bit line voltage pulse is applied to the selected bit line during the first period of the program period, and the second bit line voltage pulse is applied to the selected bit line during the second period of the program period.

9. A memory array, comprising:
a plurality of memory blocks, each of the plurality of memory blocks includes a plurality of memory cells that are coupled to a common source line;
a plurality of source switches, each of plurality of source switches corresponds to one of the plurality of memory blocks, and each of plurality of source switches is coupled to the common source line of the corresponding one of the plurality of memory blocks;
a plurality of bit lines, each of the plurality of bit lines is coupled to a group of memory cells in each of the plurality of memory blocks; and
a plurality of bit line segmentation circuits, coupled to the plurality of bit lines of the memory array, segmenting the plurality of bit lines of one of the plurality of memory arrays from another one of the plurality of the memory arrays,
wherein a selected source switch, which corresponds to a selected memory block among the plurality of memory blocks for a program operation, is configured to bias the common source line of the selected memory block to a reference voltage during a program period of the program operation, and
wherein an unselected source switch, which corresponds to an unselected memory block among the plurality of memory blocks for the program operation, is configured to float the common source line of the unselected memory block during the program period of the program operation.

10. The memory array according to claim 9, wherein
each of the plurality of source switches is controlled independently according to a control signal.

11. The memory array according to claim 10, wherein
each of the plurality of source switches is coupled between the common source line of the corresponding one of the plurality of memory blocks and a reference node that receives the reference voltage,
the selected source switch corresponding to the selected memory block is turned on to bias the common source line of the selected memory block to the reference voltage during the program period, and
the unselected source switch corresponding to the unselected memory block is turned off to float the common source line of the unselected memory block during the program period.

12. The memory array according to claim 9, wherein the plurality of bit line segmentation circuits comprises:
a first bit line segmentation circuit, coupled to a first end of each of the plurality of bit lines; and
a second bit line segmentation circuit, coupled to a second end of each of the plurality of bit lines,
wherein the first bit line segmentation circuit and the second bit line segmentation circuit are configured to segment the plurality of bit lines of the memory array from bit lines of other memory array.

13. The memory array according to claim 9, wherein
the memory array is a NOR memory array,
the plurality of memory blocks in the memory array are formed in a single semiconductor well, and
each of the plurality of memory blocks include a predetermined number of the memory cells.

14. The memory array according to claim 9, wherein
the selected memory block includes a selected memory cell for the program operation,
the selected memory cell is coupled to a selected bit line, a selected word line and a selected source line,
a reference voltage is applied to the selected source line during the program period, and
a word line voltage is applied to the selected word line during the program period, wherein word line bias voltage is an incremental step pulse voltage including a first word line voltage pulse and a second word line voltage pulse that is greater than the first word line voltage pulse, the first word line voltage pulse is applied to the selected word line during a first period of the program period, and the second word line voltage pulse is applied to the selected word line during a second period of the program period.

15. The memory array according to claim 9, wherein the selected memory block includes a selected memory cell for the program operation, the selected memory cell is coupled to a selected bit line, a selected word line and a selected source line, a reference voltage is applied to the selected source line during the program period, and a bit line voltage is applied to the selected bit line during the program period, wherein bit line bias voltage is an incremental step pulse voltage including a first bit line voltage pulse and a second bit line voltage pulse that is greater than the first bit line voltage pulse, the first bit line voltage pulse is applied to the selected bit line during a first period of the program period, and the second bit line voltage pulse is applied to the selected bit line during a second period of the program period.

16. The memory array according to claim 9, wherein the selected memory block includes a selected memory cell for the program operation, the selected memory cell is coupled to a selected bit line, a selected word line and a selected source line, a reference voltage is applied to the selected source line during the program period, and a word line voltage is applied to the selected word line during the program period, wherein word line bias voltage is an incremental step pulse voltage including a first word line voltage pulse and a second word line voltage pulse that is greater than the first word line voltage pulse, the first word line voltage pulse is applied to the selected word line during a first period of the program period, and the second word line voltage pulse is applied to the selected word line during a second period of the program period, a bit line voltage is applied to the selected bit line during the program period, wherein bit line bias voltage is an incremental step pulse voltage including a first bit line voltage pulse and a second bit line voltage pulse that is greater than the first bit line voltage pulse, the first bit line voltage pulse is applied to the selected bit line during the first period of the program period, and the second bit line voltage pulse is applied to the selected bit line during the second period of the program period.

17. A programming method of a memory device, the memory device comprises a plurality of memory arrays, each of the plurality of memory arrays comprises a plurality of memory blocks and a plurality of source switches, each of the memory blocks includes a plurality of memory cells that are coupled to a common source line, each of plurality of source switches corresponds to one of the plurality of memory blocks, and each of plurality of source switches is coupled to the common source line of the corresponding one of the plurality of memory blocks, the programming method comprising:

selecting a memory block among the plurality of memory blocks in the memory array for a program operation, wherein the selected memory block includes a selected memory cell for the program operation;

applying, by a selected source switch corresponding to a selected memory block among the plurality of memory blocks for the program operation, a reference voltage to the common source line coupled to the selected memory block of the memory array during a program period of the program operation; and floating, by an unselected source switch corresponding to an unselected memory block among the plurality of memory blocks for the program operation, the common source line coupled to the unselected memory block of the memory array during the program period of the program operation, wherein each of the plurality of memory arrays further comprises:

a plurality of bit lines, each of the plurality of bit lines is coupled to a group of memory cells in each of the plurality of memory blocks; and a plurality of bit line segmentation circuits, coupled to the plurality of bit lines of the memory array, segmenting the plurality of bit lines of one of the plurality of memory arrays from another one of the plurality of the memory arrays.

18. The programming method according to claim 17, further comprising:

applying a reference voltage to a selected source line that is coupled to the selected memory cell during the program period;

applying an incremental step pulse voltage including a first word line voltage pulse and a second word line voltage pulse to a selected word line coupled to the selected memory cell, wherein the second word line voltage pulse that is greater than the first word line voltage pulse.

19. The programming method according to claim 17, further comprising:

applying a reference voltage to a selected source line that is coupled to the selected memory cell during the program period;

applying an incremental step pulse voltage including a first bit line voltage pulse and a second bit line voltage pulse to a selected bit line coupled to the selected memory cell, wherein the second bit line voltage pulse that is greater than the first bit line voltage pulse.

* * * * *